(12) United States Patent
Shang (10) Patent No.: US 9,818,883 B2
(45) Date of Patent: Nov. 14, 2017

(54) METAL OXIDE THIN FILM TRANSISTOR AND PREPARATION METHOD THEREOF, AS WELL AS ARRAY SUBSTRATE

(71) Applicant: Boe Technology Group Co., Ltd., Beijing (CN)

(72) Inventor: Guangliang Shang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/785,606

(22) PCT Filed: Apr. 14, 2015

(86) PCT No.: PCT/CN2015/076545
§ 371 (c)(1),
(2) Date: Oct. 19, 2015

(87) PCT Pub. No.: WO2016/070574
PCT Pub. Date: May 12, 2016

(65) Prior Publication Data
US 2016/0359055 A1    Dec. 8, 2016

(30) Foreign Application Priority Data
Nov. 5, 2014  (CN) .......................... 2014 1 0635863

(51) Int. Cl.
*H01L 29/786* (2006.01)
*H01L 27/12* (2006.01)
*H01L 29/66* (2006.01)

(52) U.S. Cl.
CPC ........ *H01L 29/78696* (2013.01); *H01L 27/12* (2013.01); *H01L 29/66742* (2013.01); *H01L 29/786* (2013.01); *H01L 29/7869* (2013.01)

(58) Field of Classification Search
CPC .................................................. H01L 29/78696
See application file for complete search history.

(56) References Cited

U.S. PATENT DOCUMENTS 8,697,535 B2    4/2014  Kim et al.
9,209,246 B2 *  12/2015  Fonash ................. H01L 27/088
(Continued)

FOREIGN PATENT DOCUMENTS

CN    103579310    2/2014
CN    103762218    4/2014
(Continued)

OTHER PUBLICATIONS

International Search Report and Written Opinion from PCT/CN15/076545 dated Aug. 3, 2015.
(Continued)

*Primary Examiner* — Evan Pert
(74) *Attorney, Agent, or Firm* — Calfee, Halter & Griswold LLP (57) ABSTRACT

A metal oxide thin film transistor and a preparation method thereof, as well as an array substrate, wherein the metal oxide thin film transistor comprises a base substrate, an active layer and a source-drain metal layer formed on the base substrate that contact each other and are located in different layers, the source-drain metal layer comprising separated source electrode and drain electrode; the active layer having a hollow structure in a channel area located between the source electrode and the drain electrode.

15 Claims, 5 Drawing Sheets

(56) References Cited

U.S. PATENT DOCUMENTS

| | | |
|---|---|---|
| 2003/0022471 A1 | 1/2003 | Taketomi et al. |
| 2011/0073860 A1* | 3/2011 | Kanno .............. H01L 29/41733 257/57 |

FOREIGN PATENT DOCUMENTS

| | | |
|---|---|---|
| CN | 103943684 | 7/2014 |
| CN | 104022157 | 9/2014 |
| CN | 104241390 | 12/2014 |
| CN | 104409513 | 3/2015 |

OTHER PUBLICATIONS

Office Action from China Application No. 201410635863.6 dated Oct. 8, 2016.
Office Action from China Application No. 201410635863.6 dated Feb. 28, 2017.

\* cited by examiner

METAL OXIDE THIN FILM TRANSISTOR AND PREPARATION METHOD THEREOF, AS WELL AS ARRAY SUBSTRATE

RELATED APPLICATIONS

This is the U.S. national stage entry of PCT/CN15/076545, filed on Apr. 14, 2015, which claims priority to Chinese Application Serial No. 201410635863.6, filed Nov. 5, 2014, the entire disclosures of which are incorporated herein by reference.

FIELD OF THE DISCLOSURE

The present disclosure relates to the field of panel display technology, particularly to a metal oxide thin film transistor and a preparation method thereof, as well as an array substrate.

BACKGROUND OF THE DISCLOSURE

In recent years, the panel display has developed rapidly, and has taken over the traditional CRT display gradually. The panel display generally includes: organic light-emitting diode display (OLED), plasma display panel (PDP), liquid crystal display (LCD), and field emission display (FED) etc. The thin film transistor (TFT) is one of the key components of the panel display, which is used as a switch device or a driving device of the panel display, for example, for controlling on and off of each pixel in the panel display.

Figure 1:
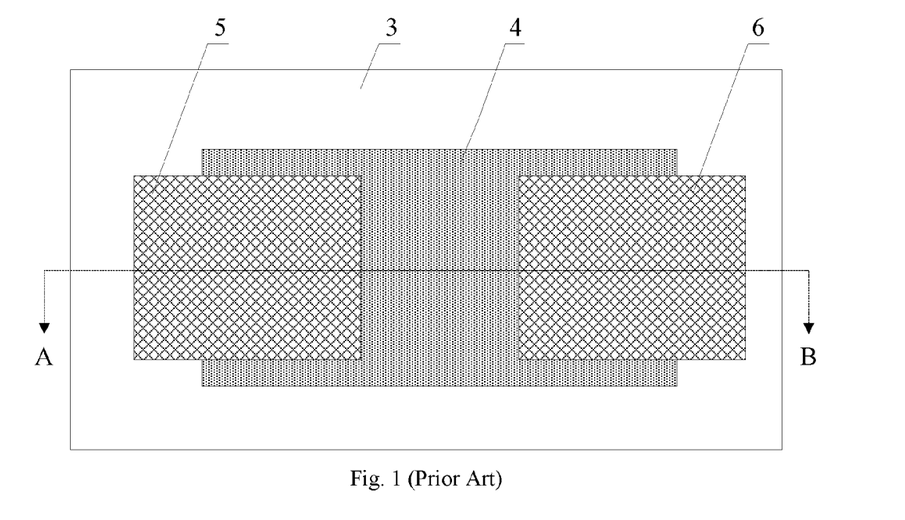
FIG. 1 is a vertical schematic view of a metal oxide TFT in the prior art.
Figure 2:
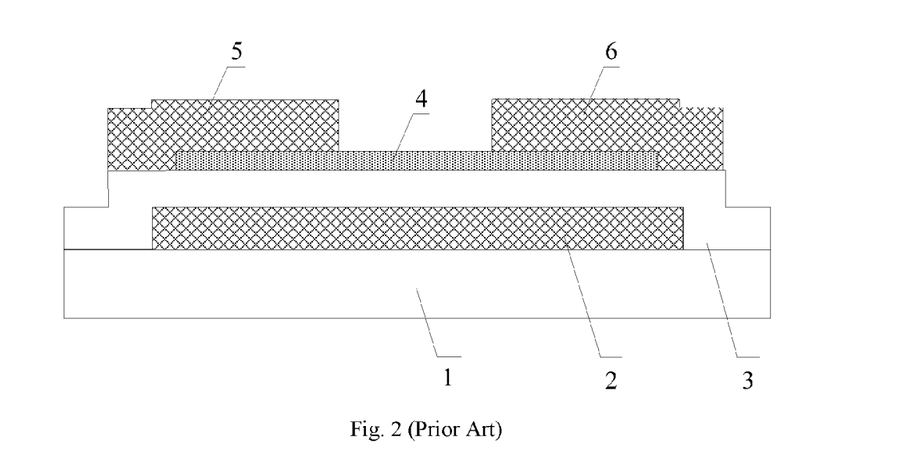
FIG. 2 is a sectional schematic view of the metal oxide TFT as shown in FIG. 1 at AB.

FIG. 1 is a vertical schematic view of an existing metal oxide TFT. FIG. 2 is a sectional schematic view of the metal oxide FTF as shown in FIG. 1 at AB. The metal oxide TFT comprises a base substrate 1, a gate electrode 2 arranged on the base substrate, a gate insulating layer 3 above the gate electrode 2, an active layer 4 above the gate insulating layer 3, the active layer 4 being a metal oxide layer; a source-drain metal layer arranged above the active layer, the source-drain metal layer comprising a source electrode 5 and a drain electrode 6. However, the existing metal oxide TFT has the following problems in the actual application: the electric current in the metal oxide TFT in the working process is unstable; the electric current is too large such that the metal oxide TFT cannot be turned off, even seriously, the metal oxide TFT may also be burned.

SUMMARY OF THE DISCLOSURE

The object of the present disclosure is to provide a metal oxide thin film transistor and a preparation method thereof, as well as an array substrate, for solving the problems that the metal oxide thin film transistor of the existing structure has an unstable electric current in the working process and a large electric current may be easily generated such that the metal oxide thin film transistor cannot be turned off.

The object of the present disclosure is carried out by the following technical solutions.

In one embodiment of the present disclosure, a metal oxide thin film transistor is provided, comprising a base substrate, an active layer and a source-drain metal layer formed on the base substrate. The source-drain metal layer comprises separated source electrode and drain electrode. The active layer includes a hollow structure in a channel area located between the source electrode and the drain electrode. In one embodiment of the present disclosure, the active layer has a hollow structure in a channel area located between the source electrode and the drain electrode, which reduces conduction path of the current carrier in a high resistance area in the vicinity of the source electrode and the drain electrode, thereby enabling the electric current that passes through the metal oxide thin film transistor in the working process to be stable. Thus, a large electric current that causes the metal oxide thin film transistor cannot be turned off will not be generated.

In some embodiments, the hollow structure is located in a middle area of the channel area. In one embodiment of the present disclosure, the area other than the middle area of the channel area can make the electric current to pass through smoothly when the metal oxide thin film transistor is turned on, and can protect electrical performance of the metal oxide thin film transistor.

In some embodiments, the length of the channel area in a direction perpendicular to the extending direction from the source electrode to the drain electrode is greater than or equal to 200 μm, an accumulated hollow length of the hollow structure on a same straight line in the direction perpendicular to the extending direction from the source electrode to the drain electrode is 2~100 μm. In the embodiment of the present disclosure, the accumulated hollow length of the hollow structure on the same straight line in a direct perpendicular to the extending direction from the source electrode to the drain electrode is less than or equal to half of the length of the channel area in this direction, so as to ensure electrical performance of the metal oxide thin film transistor.

Preferably, the accumulated hollow length of the hollow structure on a same straight line in the direction perpendicular to the extending direction from the source electrode to the drain electrode is 4~20 μm.

Preferably, a figure of the hollow structure includes one or more independent geometric figures, or a figure constituted by connecting a plurality of geometric figures together.

Preferably, the geometric figure is square, rectangle, round, ellipse, rhombus or hexagon.

Preferably, the figure of the hollow structure is a non-equilateral parallelopiped, vertexes to which two inner angles less than 120 degrees of the non-equilateral parallelopiped correspond face towards the source electrode and the drain electrode respectively, the distances between two sides parallel to the extending direction from the source electrode to the drain electrode and two sides of the adjacent channel area are respectively equal.

Preferably, the metal oxide thin film transistor further comprises an etch stop layer, the etch stop layer is arranged between the active layer and the source-drain metal layer, the source electrode and the drain electrode of the source-drain metal layer are connected with the active layer through via holes.

The beneficial effect of one embodiment of the present disclosure is as follows: the active layer has a hollow structure in a channel area located between the source electrode and the drain electrode, which reduces conduction path of the current carrier in a high resistance area in the vicinity of the source electrode and the drain electrode, thereby enabling the electric current that passes through the metal oxide thin film transistor in the working process to be stable, a large electric current that causes the metal oxide thin film transistor cannot be turned off will not be generated, thus the case of being burned by large electric current for the metal oxide thin film transistor cannot be turned off is avoided.

One embodiment of the present disclosure provides an array substrate, comprising a metal oxide thin film transistor provided by the above embodiment.

The beneficial effect of one embodiment of the present disclosure is as follows: the active layer has a hollow structure in a channel area located between the source electrode and the drain electrode, which reduces conduction path of the current carrier in a high resistance area in the vicinity of the source electrode and the drain electrode, thereby enabling the electric current that passes through the metal oxide thin film transistor in the working process to be stable, a large electric current that causes the metal oxide thin film transistor cannot be turned off will not be generated, thus the case of being burned by large electric current for the metal oxide thin film transistor cannot be turned off is avoided.

One embodiment of the present disclosure provides a preparation method of a metal oxide thin film transistor, comprising:

forming a gate electrode, a gate insulating layer and an active layer on a base substrate successively, enabling the active layer to form a hollow structure through a patterning process;

forming a source-drain metal layer on the active layer through a sputtering process, the source-drain metal layer comprising separated source electrode and drain electrode, the hollow structure of the active layer being located between the source electrode and the drain electrode.

Preferably, forming a source-drain metal layer on the active layer through a sputtering process further comprises:

forming an etch stop layer on the active layer, forming, on the etch stop layer, via holes for connecting the source electrode and the drain electrode with the active layer respectively through a patterning process.

The beneficial effect of one embodiment of the present disclosure is as follows: the active layer has a hollow structure in a channel area located between the source electrode and the drain electrode, which reduces conduction path of the current carrier in a high resistance area in the vicinity of the source electrode and the drain electrode, thereby enabling the electric current that passes through the metal oxide thin film transistor in the working process to be stable, a large electric current that causes the metal oxide thin film transistor cannot be turned off will not be generated, thus the case of being burned by large electric current for the metal oxide thin film transistor cannot be turned off is avoided.

One embodiment of the present disclosure provides a preparation method of a metal oxide thin film transistor, comprising:

forming a source-drain metal layer and an active layer on a base substrate successively, the source-drain metal layer comprising separated source electrode and drain electrode;

enabling the active layer to form a hollow structure through a patterning process, the hollow structure being located between the source electrode and the drain electrode;

forming a gate insulating layer and a gate electrode on the active layer successively.

The beneficial effect of one embodiment of the present disclosure is as follows: the active layer has a hollow structure in a channel area located between the source electrode and the drain electrode, which reduces conduction path of the current carrier in a high resistance area in the vicinity of the source electrode and the drain electrode, thereby enabling the electric current that passes through the metal oxide thin film transistor in the working process to be stable, a large electric current that causes the metal oxide thin film transistor cannot be turned off will not be generated, thus the case of being burned by large electric current for the metal oxide thin film transistor cannot be turned off is avoided.

DETAILED DESCRIPTION OF THE DISCLOSURE

Next, the implementing process of the embodiments of the present disclosure will be explained in details with reference to the drawings. It should be noted that the same or similar signs represent the same or similar components or components with the same or similar functions all along. The embodiments described below with reference to the drawings are exemplary, and are only used for explanation of the present disclosure rather than being understood as limitation to the present disclosure.

Embodiment I

One embodiment of the present disclosure provides a metal oxide thin film transistor (TFT), the metal oxide TFT comprising a base substrate, an active layer and a source-drain metal layer formed on the base substrate and located in different layers. The source-drain metal layer comprises separated source electrode and drain electrode. The active layer has a hollow structure in a channel area located between the source electrode and the drain electrode.

It should be noted that in the direction perpendicular to the extending direction from the source electrode to the drain electrode, the difference between the width of the channel area of the active layer and the maximum width of the hollow structure should be greater than or equal to the width of the existing active layer, i.e., the width difference should meet the requirement on the channel width of the metal oxide TFT.

In one embodiment of the present disclosure, the active layer has a hollow structure in the channel area located between the source electrode and the drain electrode, which reduces conduction path of the current carrier in a high resistance area in the vicinity of the source electrode and the drain electrode, thereby enabling the electric current that passes through the metal oxide TFT in the working process to be stable. Thus, a large electric current that prevents the metal oxide thin film transistor from turning off will not be generated.

Figure 3:
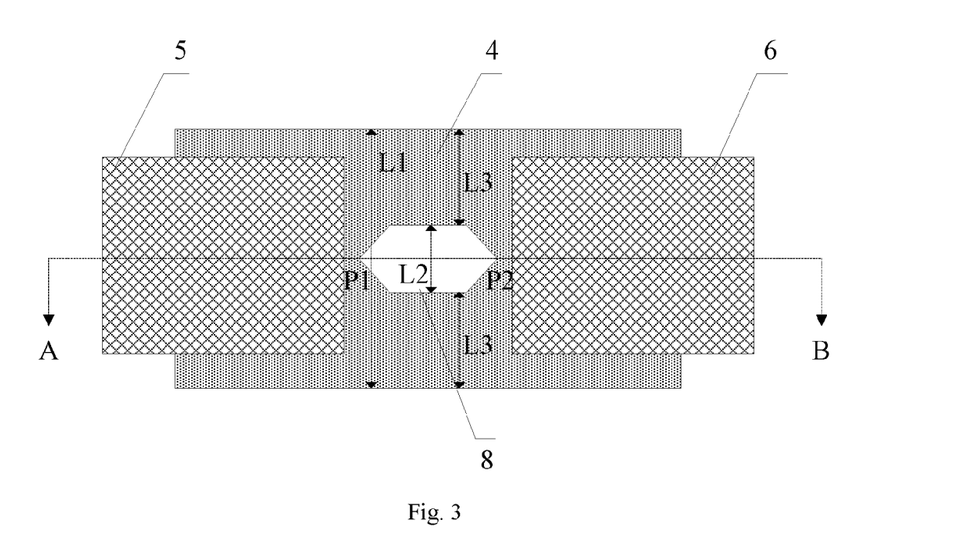
FIG. 3 is a vertical schematic view of a first metal oxide TFT provided by one embodiment of the present disclosure.

The following illustrations are provided to illustrate the metal oxide TFT provided by the embodiment of the present disclosure more clearly:

The respective embodiments are explained by taking the vertical schematic view of the metal oxide TFT as shown in FIG. 3 as the example, in order to make the drawing clear. FIG. 3 only shows an active layer 4, a source electrode 5 and a drain electrode 6. Moreover, the active layer 4 can be above the source electrode 5 and the drain electrode 6, and can also be under the source electrode 5 and the drain electrode 6.

Figure 4:
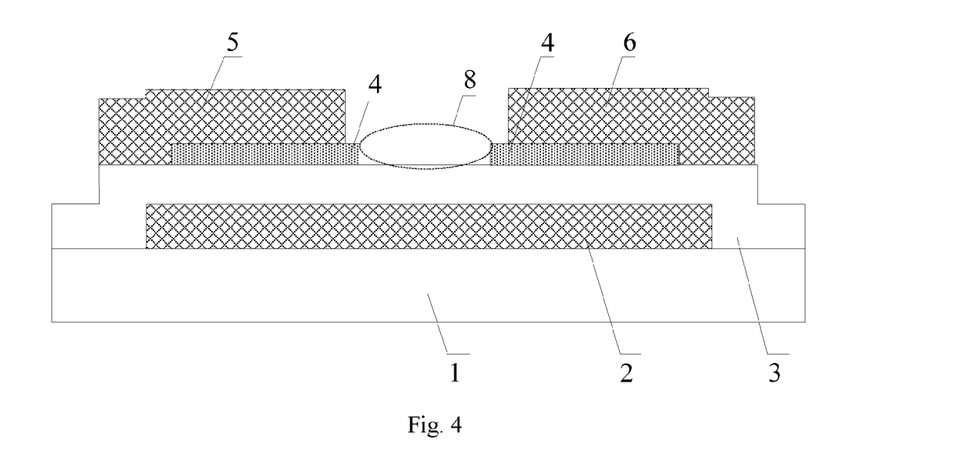
FIG. 4 is a sectional schematic view of the metal oxide TFT as shown in FIG. 3 at AB.

Referring to FIG. 3 and FIG. 4, a first metal oxide TFT is provided, wherein FIG. 3 shows a vertical schematic view of the metal oxide TFT. FIG. 4 shows a sectional schematic view of the metal oxide TFT in FIG. 3 at AB. The metal oxide TFT is a bottom gate type TFT, comprising a base substrate 1, a gate electrode 2 and a gate insulating layer 3 formed on the base substrate 1 successively, an active layer 4 formed above the gate insulating layer 3, a source-drain metal layer formed above the active layer 4 and in contact with the active layer 4, the source-drain metal layer comprising separated source electrode 5 and drain electrode 6. The active layer 4 has a hollow structure 8 in a channel area located between the source electrode 5 and the drain electrode 6. In some embodiments, the hollow structure 8 is located in a middle area of the channel area. The hollow structure is arranged in the middle area, which reduces the conduction path of the current carrier in the opposite area between the source electrode 5 and the drain electrode 6, and avoids generation of large electric current. In one embodiment of the present disclosure, the area other than the middle area of the channel area allows the electric current to pass through smoothly when the metal oxide TFT is turned on, without influencing the electrical performance of the metal oxide TFT. The hollow structure can reduce the conduction path of the current carrier in the high resistance area in the vicinity of the source electrode 5 and the drain electrode 6, and a large electric current that causes the metal oxide TFT cannot be turned off will not be generated.

In some embodiments, the length L1 of the channel area in a direction perpendicular to the extending direction from the source electrode 5 to the drain electrode 6 is greater than or equal to 200 μm; and the accumulated hollow length L2 of the hollow structure 8 on the same straight line in the direction perpendicular to the extending direction from the source electrode 5 to the drain electrode 6 is 2~100 μm. It is set so that the length of the channel area of the active layer in the direction perpendicular to the extending direction from the source electrode 5 to the drain electrode 6 in the prior art is L, then L1-L2 is greater than or equal to L. Further preferably, the accumulated hollow length L2 of the hollow structure 8 on the same straight line in the direction perpendicular to the extending direction from the source electrode 5 to the drain electrode 6 is 4~20 μm. In one embodiment of the present disclosure, the accumulated hollow length L2 of the hollow structure 8 on the same straight line in the direction perpendicular to the extending direction from the source electrode 5 to the drain electrode 6 is less than or equal to half of the length L1 of the channel area in this direction, so as to ensure the electrical performance of the metal oxide TFT.

In one embodiment of the present disclosure, the active layer 4 with the hollow structure 8 can reduce the conduction path of current carrier in the high resistance area in the vicinity of the source electrode 5 and the drain electrode 6, thereby enabling the electric current that passes through the metal oxide TFT in the working process to be stable, thus, a large electric current that causes the metal oxide thin film transistor cannot be turned off will not be generated.

Figure 5:
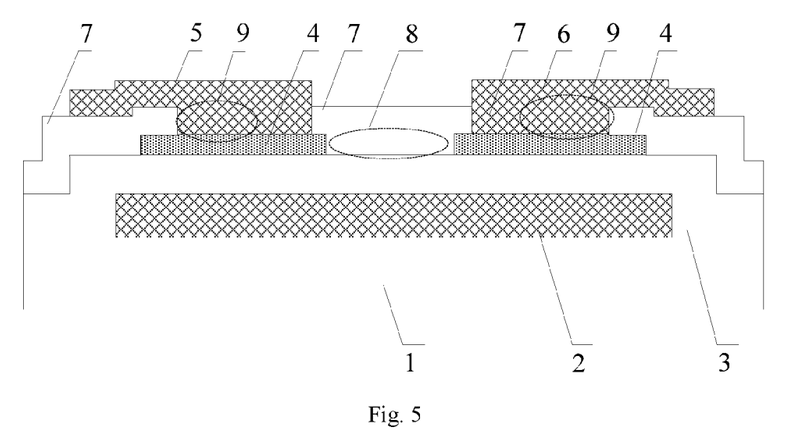
FIG. 5 is a sectional schematic view of a second metal oxide TFT provided by another embodiment of the present disclosure.

Referring to FIG. 3 and FIG. 5, a second metal oxide TFT is provided. FIG. 3 shows a vertical schematic view of the metal oxide TFT. FIG. 5 shows a sectional schematic view of the metal oxide TFT in FIG. 3 at AB. The metal oxide TFT is a bottom gate type TFT, comprising a base substrate 1, a gate electrode 2 and a gate insulating layer 3 formed on the base substrate 1 successively; an active layer 4 formed above the gate insulating layer 3; the active layer 4 having a hollow structure 8 in a channel area located between the source electrode 5 and the drain electrode 6. Preferably, the hollow structure 8 is located in a middle area of the channel area. In one embodiment of the present disclosure, the area other than the middle area of the channel area can make the electric current to pass through smoothly when the metal oxide TFT is turned on, in the case of not influencing the electrical performance of the metal oxide TFT, the hollow structure can reduce the conduction path of the current carrier in the high resistance area in the vicinity of the source electrode 5 and the drain electrode 6, and a large electric current that causes the metal oxide TFT cannot be turned off will not be generated.

Preferably, the length L1 of the channel area in a direction perpendicular to the extending direction from the source electrode 5 to the drain electrode 6 is greater than or equal to 200 μm, the accumulated hollow length L2 of the hollow structure 8 on the same straight line in the direction perpendicular to the extending direction from the source electrode 5 to the drain electrode 6 is 2~100 μm. It is set that length of the channel area of the active layer in the direction perpendicular to the extending direction from the source electrode 5 to the drain electrode 6 in the prior art is L, then L1-L2 is greater than or equal to L. Preferably, the accumulated hollow length L2 of the hollow structure 8 on the same straight line in the direction perpendicular to the extending direction from the source electrode 5 to the drain electrode 6 is 4~20 μm. In one embodiment of the present disclosure, the accumulated hollow length L2 of the hollow structure 8 on the same straight line in the direction perpendicular to the extending direction from the source electrode 5 to the drain electrode 6 is less than or equal to half of the length L1 of the channel area in this direction, so as to ensure the electrical performance of the metal oxide TFT.

Preferably, the metal oxide TFT further comprises an etch stop layer 7 formed above the active layer 4, the etch stop layer 7 further having a hollow structure with the same figure as the active layer 4, and comprising a via hole 9 for enabling the source electrode 5 and the drain electrode 6 of the source-drain metal layer to be connected with the active layer 4; a source-drain metal layer formed above the etch stop layer 7, the source-drain metal layer comprising separated source electrode 5 and drain electrode 6, the source electrode 5 and the drain electrode 6 being connected with the active layer 4 through via holes 9 at corresponding positions respectively. The etch stop layer 7 can, when fabricating the source-drain metal layer, prevent the metal from being sputtered to the active layer 4 or etching the active layer 4 in the etching process, thereby playing protection function to the active layer 4, and avoiding damage to the active layer 4. In one embodiment of the present disclosure, the active layer 4 with the hollow structure 8 can reduce the conduction path of current carrier in the high resistance area in the vicinity of the source electrode 5 and the drain electrode 6, thereby enabling the electric current that passes through the metal oxide TFT in the working process to be stable, thus, a large electric current that prevents the metal oxide thin film transistor from turning off will not be generated.

Figure 6:
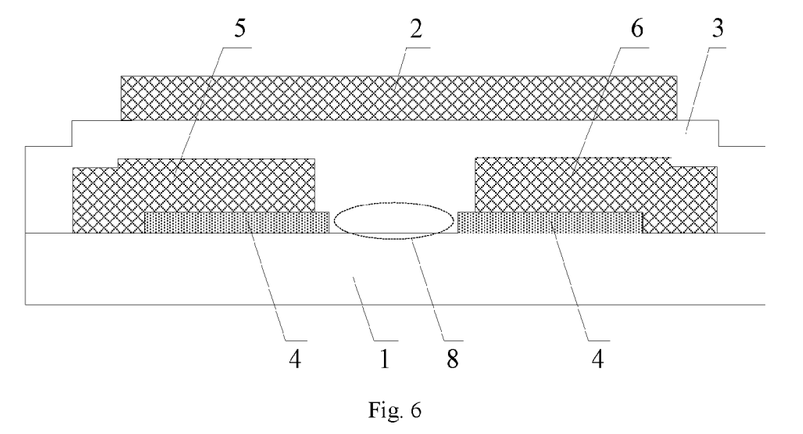
FIG. 6 is a sectional schematic view of a third metal oxide TFT provided by a further embodiment of the present disclosure.

Referring to FIG. 3 and FIG. 6, a third metal oxide TFT is provided, wherein FIG. 3 shows a vertical schematic view of the metal oxide TFT, FIG. 6 shows a sectional schematic view of the metal oxide TFT in FIG. 3 at AB. The metal oxide TFT is a top gate type TFT, comprising a base substrate 1, a source-drain metal layer formed on the base substrate 1, the source-drain metal layer comprising separated source electrode 5 and drain electrode 6; an active layer 4 formed above the source-drain metal layer, the active layer 4 having a hollow structure 8 in a channel area located between the source electrode 5 and the drain electrode 6. Preferably, the hollow structure 8 is located in a middle area of the channel area. In one embodiment of the present disclosure, the area other than the middle area of the channel area can make the electric current to pass through smoothly when the metal oxide TFT is turned on, and can protect electrical performance of the metal oxide TFT.

Preferably, the length L1 of the channel area in a direction perpendicular to the extending direction from the source electrode 5 to the drain electrode 6 is greater than or equal to 200 μm, the accumulated hollow length L2 of the hollow structure 8 on the same straight line in the direction perpendicular to the extending direction from the source electrode 5 to the drain electrode 6 is 2~100 μm. It is set that length of the channel area of the active layer in the direction perpendicular to the extending direction from the source electrode 5 to the drain electrode 6 in the prior art is L, then L1-L2 is greater than or equal to L. Preferably, the accumulated hollow length L2 of the hollow structure 8 on the same straight line in the direction perpendicular to the extending direction from the source electrode 5 to the drain electrode 6 is 4~20 μm. In one embodiment of the present disclosure, the accumulated hollow length L2 of the hollow structure 8 on the same straight line in the direction perpendicular to the extending direction from the source electrode 5 to the drain electrode 6 is less than or equal to half of the length L1 of the channel area in this direction, so as to ensure the electrical performance of the metal oxide TFT.

The metal oxide TFT further comprises a gate insulating layer 3 formed above the active layer 4, a gate electrode formed above the gate insulating layer 3. In the embodiment of the present disclosure, the active layer 4 with the hollow structure 8 can reduce the conduction path of current carrier in the high resistance area in the vicinity of the source electrode 5 and the drain electrode 6, thereby enabling the electric current that passes through the metal oxide TFT in the working process to be stable, thus, a large electric current that prevents the metal oxide thin film transistor from turning off will not be generated.

As for the metal oxide TFT as shown in FIG. 4 to FIG. 6, the figure of the hollow structure 8 of the active layer 4 can include one or more independent geometric figures, or the figure of the hollow structure 8 is a figure constituted by connecting a plurality of geometric figures together, preferably, the geometric figure of the hollow structure 8 may be square, rectangle, round, ellipse, rhombus or hexagon.

Figure 7:
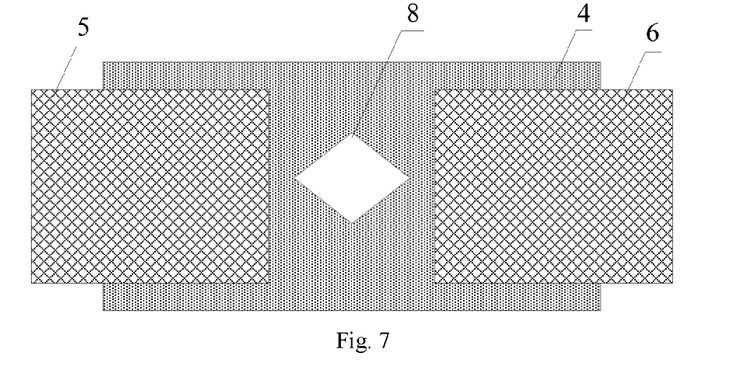
FIG. 7 is a schematic view of a first hollow structure of an active layer provided by one embodiment of the present disclosure.

For example, the active layer 4 as shown in FIG. 7 has a hollow structure 8 in the channel area located between the source electrode 5 and the drain electrode 6, the hollow structure 8 is a rhombus.

Figure 8:
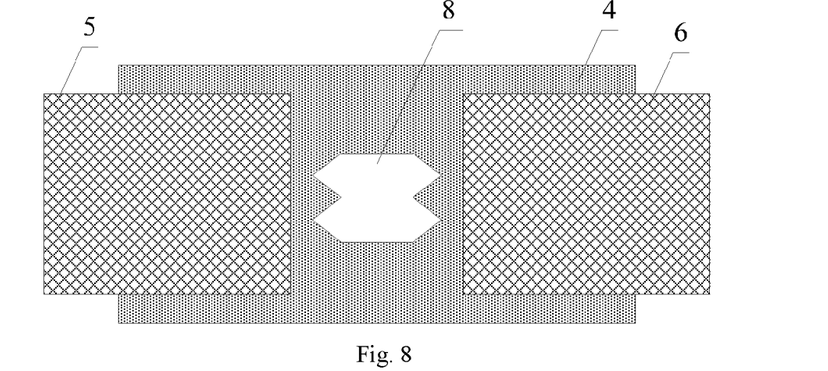
FIG. 8 is a schematic view of a second hollow structure of an active layer provided by another embodiment of the present disclosure.

For example again, the active layer 4 as shown in FIG. 8 has a hollow structure 8 in the channel area located between the source electrode 5 and the drain electrode 6, the hollow structure is two hexagons connected together.

Figure 9:
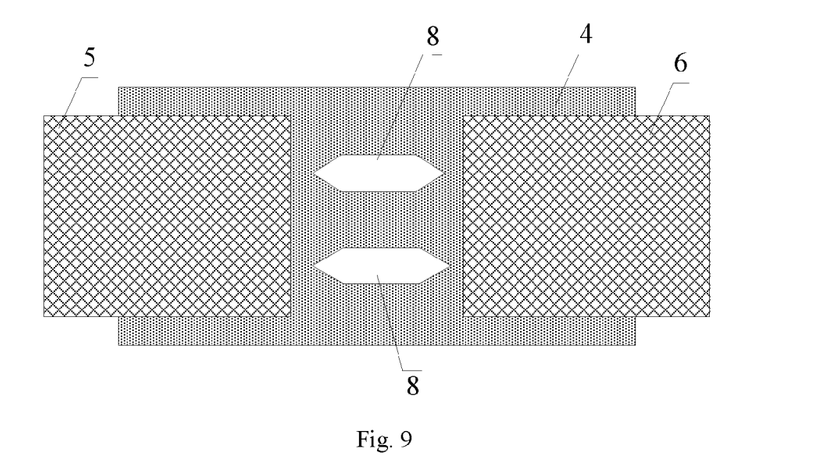
FIG. 9 is a schematic view of a third hollow structure of an active layer provided by a further embodiment of the present disclosure.

For example again, the active layer 4 as shown in FIG. 9 has a hollow structure 8 in the channel area located between the source electrode 5 and the drain electrode 6, the hollow structure is two separated and independent hexagons.

Preferably, as shown in FIG. 3, the active layer 4 has a hollow structure 8 in the channel area located between the source electrode 5 and the drain electrode 6. The figure of the hollow structure 8 is a non-equilateral parallelopiped, vertex P1 and vertex P2 to which two inner angles less than 120 degrees of the non-equilateral parallelopiped correspond face towards the source electrode 5 and the drain electrode 6 respectively, the distances between two sides parallel to the extending direction from the source electrode 5 to the drain electrode 6 and two sides of the adjacent channel area are respectively equal, which is denoted as L3. In the embodiment of the present disclosure, the middle area of the active layer 4 is the hollow structure 8 of a non-equilateral parallelopiped, which can reduce the conduction path in the high resistance area in the vicinity of the source electrode 5 and the drain electrode 6, thereby avoiding generation of large electric current; moreover, the distances between the two sides of the hollow structure 8 parallel to the extending direction from the source electrode 5 to the drain electrode 6 and the two sides of the adjacent channel area are respectively equal, hence, the conduction path of the active layer is balanced.

The above hollow structure is only a part of examples of the embodiments of the present disclosure, all the variations of the hollow structure of the active layer 4 in the channel area made for the purpose of improving the performance of the metal oxide TFT fall within the protection scope of the present disclosure.

Embodiment II

One embodiment of the present disclosure provides an array substrate comprising a metal oxide TFT provided by the above embodiment. The metal oxide TFT may serve as a switch device or a driving device of the array substrate.

The beneficial effect of one embodiment of the present disclosure is as follows: the active layer has a hollow structure in a channel area located between the source electrode and the drain electrode, which reduces conduction path of the current carrier in a high resistance area in the vicinity of the source electrode and the drain electrode, thereby enabling the electric current that passes through the metal oxide thin film transistor in the working process to be stable, a large electric current that prevents the metal oxide thin film transistor from turning off will not be generated, thus preventing it from being burned by large electric current for the metal oxide thin film transistor.

Embodiment III

Figure 10:
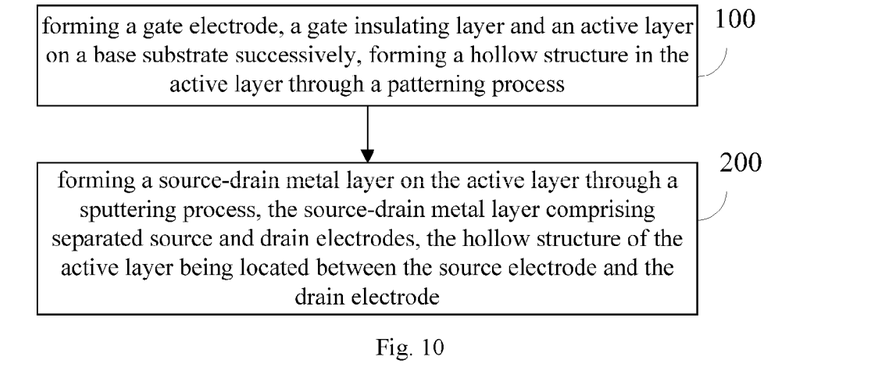
FIG. 10 is a flow chart of a preparation method of a first metal oxide TFT provided by one embodiment of the present disclosure.

Referring to FIG. 10, one embodiment of the present disclosure provides a preparation method of a metal oxide thin film transistor, comprising:

Step 100: forming a gate electrode, a gate insulating layer and an active layer on a base substrate successively, enabling the active layer to form a hollow structure through a patterning process.

Preferably, a hollow structure is formed in the middle area of the channel area. In the embodiment of the present disclosure, the area other than the middle area of the channel area can make the electric current to pass through smoothly when the metal oxide thin film transistor is turned on, and can protect electrical performance of the metal oxide thin film transistor.

Preferably, the length of the channel area in a direction perpendicular to the extending direction from the source electrode to the drain electrode is greater than or equal to 200 µm, the accumulated hollow length of the hollow structure on a same straight line in the direction perpendicular to the extending direction from the source electrode to the drain electrode is 2~100 µm. In one embodiment of the present disclosure, the accumulated hollow length of the hollow structure on the same straight line in a direct perpendicular to the extending direction from the source electrode to the drain electrode is less than or equal to half of the length of the channel area in this direction, so as to ensure electrical performance of the metal oxide thin film transistor.

Preferably, the accumulated hollow length of the hollow structure on a same straight line in the direction perpendicular to the extending direction from the source electrode to the drain electrode is 4~20 µm.

Preferably, a figure of the hollow structure includes one or more independent geometric figures, or a figure constituted by connecting a plurality of geometric figures together.

Preferably, the geometric figure is square, rectangle, round, ellipse, rhombus or hexagon.

Preferably, the figure of the hollow structure is a non-equilateral parallelopiped, vertexes to which two inner angles less than 120 degrees of the non-equilateral parallelopiped correspond face towards the source electrode and the drain electrode respectively, the distances between two sides parallel to the extending direction from the source electrode to the drain electrode and two sides of the adjacent channel area are respectively equal.

Step 200: forming a source-drain metal layer on the active layer through a sputtering process, the source-drain metal layer comprising separated source electrode and drain electrode, the hollow structure of the active layer being located between the source electrode and the drain electrode.

The bottom gate type metal oxide TFT prepared by one embodiment of the present disclosure, by enabling the active layer to have a hollow structure in the channel area located between the source electrode and the drain electrode, reduces conduction path of the current carrier in a high resistance area in the vicinity of the source electrode and the drain electrode, thereby enabling the electric current that passes through the metal oxide thin film transistor in the working process to be stable, a large electric current that prevents the metal oxide thin film transistor from turning off will not be generated, thus the case of the transistor being burned by large electric current for the metal oxide thin film transistor is avoided.

Figure 11:
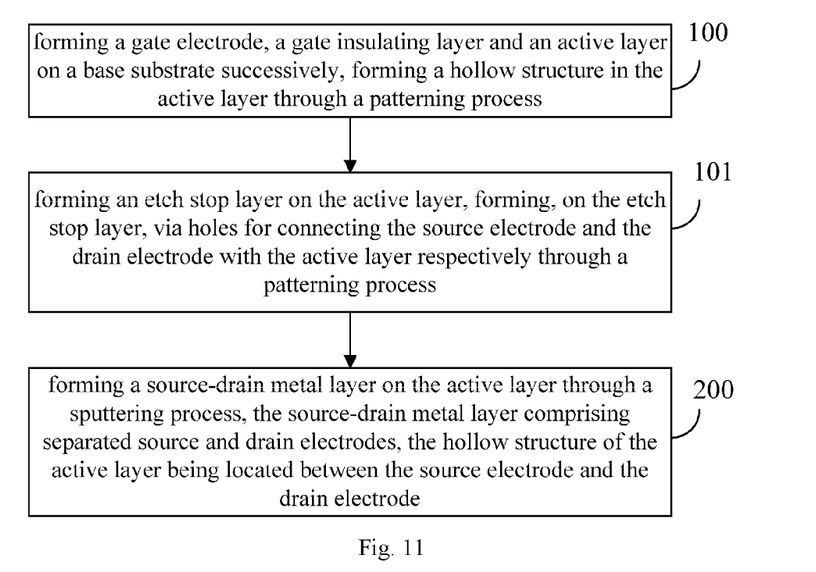
FIG. 11 is a flow chart of a preparation method of a second metal oxide TFT provided by another embodiment of the present disclosure.

Referring to FIG. 11, the embodiment of the present disclosure provides a preparation method of a second metal oxide TFT, comprising:

Step 100, forming a gate electrode, a gate insulating layer and an active layer on a base substrate successively, enabling the active layer to form a hollow structure through a patterning process.

Preferably, a hollow structure is formed in the middle area of the channel area. In the embodiment of the present disclosure, the area other than the middle area of the channel area can make the electric current to pass through smoothly when the metal oxide thin film transistor is turned on, and can protect electrical performance of the metal oxide thin film transistor.

Preferably, the length of the channel area in a direction perpendicular to the extending direction from the source electrode to the drain electrode is greater than or equal to 200 µm, the accumulated hollow length of the hollow structure on a same straight line in the direction perpendicular to the extending direction from the source electrode to the drain electrode is 2~100 µm. In one embodiment of the present disclosure, the accumulated hollow length of the hollow structure on the same straight line in a direct perpendicular to the extending direction from the source electrode to the drain electrode is less than or equal to half of the length of the channel area in this direction, so as to ensure electrical performance of the metal oxide thin film transistor.

Preferably, the accumulated hollow length of the hollow structure on a same straight line in the direction perpendicular to the extending direction from the source electrode to the drain electrode is 4~20 µm.

Preferably, a figure of the hollow structure includes one or more independent geometric figures, or a figure constituted by connecting a plurality of geometric figures together.

Preferably, the geometric figure is square, rectangle, round, ellipse, rhombus or hexagon.

Preferably, the figure of the hollow structure is a non-equilateral parallelopiped, vertexes to which two inner angles less than 120 degrees of the non-equilateral parallelopiped correspond face towards the source electrode and the drain electrode respectively, the distances between two sides parallel to the extending direction from the source electrode to the drain electrode and two sides of the adjacent channel area are respectively equal.

Step 101: forming an etch stop layer on the active layer, forming, on the etch stop layer, via holes for connecting the source electrode and the drain electrode with the active layer respectively through a patterning process.

Step 200: forming a source-drain metal layer on the active layer through a sputtering process, the source-drain metal layer comprising separated source electrode and drain electrode, the hollow structure of the active layer being located between the source electrode and the drain electrode.

The bottom gate type metal oxide TFT prepared by one embodiment of the present disclosure, by enabling the active layer to have a hollow structure in the channel area located between the source electrode and the drain electrode, reduces conduction path of the current carrier in a high resistance area in the vicinity of the source electrode and the drain electrode, thereby enabling the electric current that passes through the metal oxide thin film transistor in the working process to be stable, a large electric current that prevents the metal oxide thin film transistor from turning off will not be generated, thus the case of it being burned by large electric current for the metal oxide thin film transistor is avoided; compared with the flow chart of the preparation method as shown in FIG. 10, the preparation method provided by this embodiment further comprises preparing an etch stop layer, the etch stop layer is prepared between the source electrode and the drain electrode, thereby being capable of protecting the prepared active layer effectively when preparing the source electrode and the drain electrode.

Figure 12:
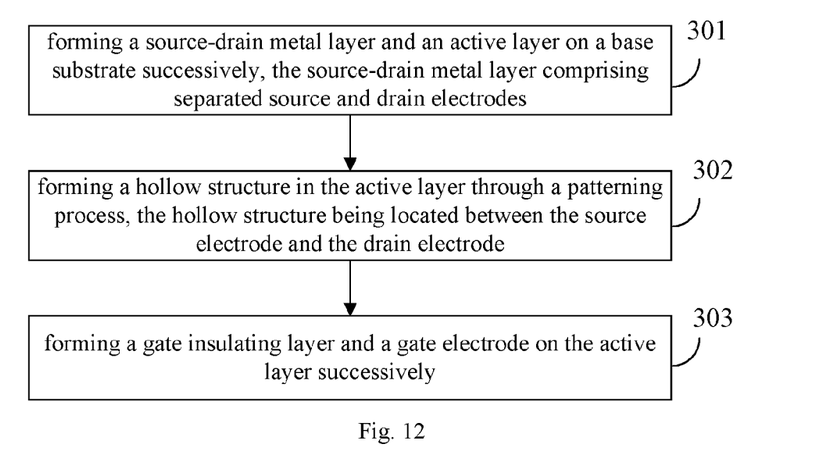
FIG. 12 is a flow chart of a preparation method of a third metal oxide TFT provided by a further embodiment of the present disclosure.

Referring to FIG. 12, one embodiment of the present disclosure provides a preparation method of a third metal oxide TFT, comprising:

Step 301, forming a source-drain metal layer and an active layer on a base substrate successively, the source-drain metal layer comprising separated source electrode and drain electrode.

Step 302, enabling the active layer to form a hollow structure through a patterning process, the hollow structure being located between the source electrode and the drain electrode.

Preferably, a hollow structure is formed in the middle area of the channel area. In the embodiment of the present disclosure, the area other than the middle area of the channel area can make the electric current to pass through smoothly when the metal oxide thin film transistor is turned on, and can protect electrical performance of the metal oxide thin film transistor.

Preferably, the length of the channel area in a direction perpendicular to the extending direction from the source electrode to the drain electrode is greater than or equal to 200 μm, the accumulated hollow length of the hollow structure on a same straight line in the direction perpendicular to the extending direction from the source electrode to the drain electrode is 2~100 μm. In one embodiment of the present disclosure, the accumulated hollow length of the hollow structure on the same straight line in a direct perpendicular to the extending direction from the source electrode to the drain electrode is less than or equal to half of the length of the channel area in this direction, so as to ensure electrical performance of the metal oxide thin film transistor.

Preferably, the accumulated hollow length of the hollow structure on a same straight line in the direction perpendicular to the extending direction from the source electrode to the drain electrode is 4~20 μm.

Preferably, a figure of the hollow structure includes one or more independent geometric figures, or a figure constituted by connecting a plurality of geometric figures together.

Preferably, the geometric figure is square, rectangle, round, ellipse, rhombus or hexagon.

Preferably, the figure of the hollow structure is a non-equilateral parallelopiped, vertexes to which two inner angles less than 120 degrees of the non-equilateral parallelopiped correspond face towards the source electrode and the drain electrode respectively, the distances between two sides parallel to the extending direction from the source electrode to the drain electrode and two sides of the adjacent channel area are respectively equal.

Step 303, forming a gate insulating layer and a gate electrode on the active layer successively.

The top gate type metal oxide TFT prepared by one embodiment of the present disclosure, by enabling the active layer to have a hollow structure in the channel area located between the source electrode and the drain electrode, reduces conduction path of the current carrier in a high resistance area in the vicinity of the source electrode and the drain electrode, thereby enabling the electric current that passes through the metal oxide thin film transistor in the working process to be stable, a large electric current that causes the metal oxide thin film transistor cannot be turned off will not be generated, thus the case of being burned by large electric current for the metal oxide thin film transistor cannot be turned off is avoided.

Apparently, the skilled person in the art can make various modifications and variations to the present disclosure without departing from the spirit and scope of the present disclosure. Thus, provided that these modifications and variations of the present disclosure belong to the scopes of the claims of the present disclosure and the equivalent technologies thereof, the present disclosure also intends to cover these modifications and variations.

The invention claimed is:

1. A preparation method of a metal oxide thin film transistor, comprising:
    forming a gate electrode, a gate insulating layer and an active layer on a base substrate successively, forming a hollow structure in the active layer through a patterning process;
    forming a source-drain metal layer on the active layer through a sputtering process, the source-drain metal layer comprising separated source and drain electrodes, the hollow structure of the active layer being located between the source electrode and the drain electrode.

2. The preparation method as claimed in claim 1, wherein forming a source-drain metal layer on the active layer through a sputtering process further comprises:
    forming an etch stop layer on the active layer, forming, on the etch stop layer, via holes for connecting the source electrode and the drain electrode with the active layer respectively through a patterning process.

3. A preparation method of a metal oxide thin film transistor, comprising:
    forming a source-drain metal layer and an active layer on a base substrate successively, the source-drain metal layer comprising separated source and drain electrodes;
    forming a hollow structure in the active layer through a patterning process, the hollow structure being located between the source electrode and the drain electrode;
    forming a gate insulating layer and a gate electrode on the active layer successively.

4. The preparation method as claimed in claim 1, wherein forming the hollow structure comprises: forming the hollow structure in a middle area of the channel area.

5. The preparation method as claimed in claim 1, wherein the length of the channel area in a direction perpendicular to an extending direction from the source electrode to the drain electrode is greater than or equal to 200 μm, and an accumulated hollow length of the hollow structure on a same straight line in the direction perpendicular to the extending direction from the source electrode to the drain electrode is 2~100 μm.

6. The preparation method as claimed in claim 5, wherein the accumulated hollow length of the hollow structure is 4~20 μm.

7. The preparation method as claimed in claim 1, wherein forming the hollow structure comprises: forming the hollow structure to have a figure of one or more independent geometric figures, or a figure constituted by connecting a plurality of geometric figures together.

8. The preparation method as claimed in claim 7, wherein the geometric figure is square, rectangle, round, ellipse, rhombus or hexagon.

9. The preparation method as claimed in claim 8, wherein the figure of the hollow structure is a non-equilateral parallelopiped, vertexes to which two inner angles less than 120 degrees of the non-equilateral parallelopiped correspond face towards the source electrode and the drain electrode respectively, and wherein the distances between two sides parallel to the extending direction from the source electrode to the drain electrode and two sides of the adjacent channel area are respectively equal.

10. The preparation method as claimed in claim 3, wherein forming the hollow structure comprises: forming the hollow structure in a middle area of the channel area.

11. The preparation method as claimed in claim 3, wherein the length of the channel area in a direction perpendicular to an extending direction from the source electrode to the drain electrode is greater than or equal to 200 μm, and an accumulated hollow length of the hollow structure on a same straight line in the direction perpendicular to the extending direction from the source electrode to the drain electrode is 2~100 μm.

12. The preparation method as claimed in claim 11, wherein the accumulated hollow length of the hollow structure is 4~20 μm.

13. The preparation method as claimed in claim 3, wherein forming the hollow structure comprises: forming the hollow structure to have a figure of one or more independent geometric figures, or a figure constituted by connecting a plurality of geometric figures together.

14. The preparation method as claimed in claim 13, wherein the geometric figure is square, rectangle, round, ellipse, rhombus or hexagon.

15. The preparation method as claimed in claim 14, wherein the figure of the hollow structure is a non-equilateral parallelopiped, vertexes to which two inner angles less than 120 degrees of the non-equilateral parallelopiped correspond face towards the source electrode and the drain electrode respectively, and wherein the distances between two sides parallel to the extending direction from the source electrode to the drain electrode and two sides of the adjacent channel area are respectively equal.

* * * * *